(12) United States Patent
Ying et al.

(10) Patent No.: US 11,735,279 B2
(45) Date of Patent: Aug. 22, 2023

(54) PROGRAMMABLE MEMORY CELL, MEMORY ARRAY AND READING AND WRITING METHOD THEREOF

(71) Applicant: ChangXin Memory Technologies, Inc., Hefei (CN)

(72) Inventors: Zhan Ying, Hefei (CN); Xin Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 134 days.

(21) Appl. No.: 17/432,791

(22) PCT Filed: Jul. 23, 2020

(86) PCT No.: PCT/CN2020/103870
§ 371 (c)(1),
(2) Date: Aug. 20, 2021

(87) PCT Pub. No.: WO2021/103606
PCT Pub. Date: Jun. 3, 2021

(65) Prior Publication Data
US 2022/0130479 A1    Apr. 28, 2022

(30) Foreign Application Priority Data

Nov. 28, 2019  (CN) .......................... 201911193706.3

(51) Int. Cl.
*G11C 17/16*  (2006.01)
*G11C 17/18*  (2006.01)

(52) U.S. Cl.
CPC .............. *G11C 17/16* (2013.01); *G11C 17/18* (2013.01)

(58) Field of Classification Search
USPC .......................................... 365/96
See application file for complete search history.

(56) References Cited

U.S. PATENT DOCUMENTS 5,875,144 A *  2/1999  Zheng .................. G11C 29/789
                                                        365/100
7,920,401 B2 *  4/2011  Xu ........................ G11C 17/18
                                                        365/96

(Continued)

FOREIGN PATENT DOCUMENTS

CN       103730164 A       4/2014
CN       104078080 A      10/2014

(Continued)

OTHER PUBLICATIONS

PCT/CN2020/103870 International Search Report dated Oct. 28, 2020.

(Continued)

*Primary Examiner* — Muna A Techane
(74) *Attorney, Agent, or Firm* — Alston & Bird LLP (57) ABSTRACT

The present disclosure in the field of memory technology proposes a programmable storage cell, a programmable storage array and a reading and writing method for the programmable storage array. The programmable storage cell includes: a first anti-fuse element connected between a first power terminal and an output terminal, a second anti-fuse element connected between the second power terminal and the output terminal, and a third switch unit connected to the output terminal, a third power terminal and a position signal terminal, where the third switch unit responds to the signal from the position signal terminal so as to connect the third power terminal and the output terminal. The programmable storage cell has a simple structure and a high reading speed.

15 Claims, 5 Drawing Sheets

(56) References Cited

U.S. PATENT DOCUMENTS

| | | | | |
|---|---|---|---|---|
| 9,036,445 | B1* | 5/2015 | Shin | G11C 5/148 |
| | | | | 365/96 |
| 10,665,311 | B2* | 5/2020 | Miyatake | G11C 29/027 |
| 10,847,236 | B2* | 11/2020 | Hoang | G11C 29/024 |
| 2004/0017702 | A1 | 1/2004 | Fournel et al. | |
| 2007/0127283 | A1* | 6/2007 | Gosmain | G11C 7/24 |
| | | | | 365/96 |
| 2022/0122680 | A1* | 4/2022 | Li | G11C 17/16 |

FOREIGN PATENT DOCUMENTS

| | | |
|---|---|---|
| CN | 108701486 A | 10/2018 |
| CN | 21063992 U | 5/2020 |
| WO | WO 2021/103606 A1 | 6/2021 |

OTHER PUBLICATIONS

PCT/CN2020/103870 Written Opinion of the International Searching Authority dated Oct. 28, 2020.

* cited by examiner

PROGRAMMABLE MEMORY CELL, MEMORY ARRAY AND READING AND WRITING METHOD THEREOF

CROSS REFERENCES TO RELATED APPLICATIONS

This application claims the benefit of priority to CN Patent Application 201911193706.3 filed on Nov. 28, 2019, both entitled "Programmable Memory Cell, Memory Array and Reading and Writing Method Thereof", the contents of which are incorporated herein by reference in its entirety.

TECHNICAL FIELD

The present disclosure relates to the field of storage technology, in particular to a programmable storage unit, a programmable storage array and a reading and writing method.

BACKGROUND

Since the one time programmable (OTP) memory has the characteristic that the storage state is not affected by power failures, it can be used in various technical fields. As an example, one-time programmable storage cells can be used in a dynamic random access memory (DRAM) to control the turning on or off of redundant storage cells. For example, when a storage cell in the storage cell area corresponding to a word line is defective, the corresponding one-time programmable storage cell will be programmed (for example, from logic "0" to logic "1"), and the DRAM control circuit will turn off the read and write function to the storage cell which corresponds to this word line, and open read and write of the storage cell in the redundant area. At this time, the corresponding storage cell in the redundant area completely replaces the storage cell in the defective memory area. Thus the defect of DRAM is repaired.

However, the existing one-time programmable storage cells have complex structures, occupy large areas, present slow data reading spell and poor reliability.

It should be noted that the information disclosed in the above background section is only used to enhance the understanding of the background of the present disclosure, and therefore may include information that does not constitute the prior art known to those of ordinary skill in the art.

SUMMARY

According to an aspect of the present disclosure, a programmable storage cell includes a first anti-fuse connected between a first power terminal and an output terminal; a second anti-fuse connected between a second power terminal and the output terminal; and a third switch unit connected to the output terminal, a third power terminal, and a position signal terminal, wherein the third switch unit connects the third power terminal to the output terminal in response to a signal from the position signal terminal.

In some examples, a first switch unit is connected to the first power terminal, a first terminal of the first anti-fuse, and a first control terminal, wherein the first switch unit connects the first power terminal to the first terminal of the first anti-fuse in response to a signal from the first control terminal; and a second switch unit is connected to the second power terminal, a first terminal of the second anti-fuse, and the first control terminal, wherein the second switch unit connects the second power terminal to the first terminal of the second anti-fuse in response to the signal from the first control terminal.

In some examples, the programmable storage cell further comprises a D-type flip-flop, wherein a data input terminal of the D-type flip-flop is connected to the output terminal, and wherein a clock terminal of the D-type flip-flop is connected to a clock signal.

In some examples, the third switch unit comprises: a third transistor, wherein a control terminal of the third transistor is connected to the position signal terminal, a first terminal of the third transistor is connected to the output terminal, and a second terminal of the third transistor is connected to the third power terminal.

In some examples, the first switch unit comprises: a first transistor, wherein a control terminal of the first transistor is connected to the first control terminal, a first terminal of the first transistor is connected to the first power terminal, and the second terminal of the first transistor is connected to the first terminal of the first anti-fuse; and wherein the second switch unit comprises: a second transistor, wherein a control terminal of the second transistor is connected to the first control terminal, a first terminal of the second transistor is connected to the second power terminal, and the second terminal of the second transistor is connected to the first terminal of the second anti-fuse.

According to another aspect of the present disclosure, a programmable storage array is provided which includes: a plurality of anti-fuse groups, a plurality of output terminals, wherein each of the plurality of anti-fuse groups connects to one of the plurality of output terminals in a one-to-one correspondence, wherein each of the plurality of anti-fuse groups comprises a first anti-fuse and a second anti-fuse, wherein the first anti-fuse is connected between a first power terminal and a corresponding one of the plurality of output terminals, and the second anti-fuse is connected between a second power terminal and a same one of the plurality of output terminals as the first anti-fuse; a plurality of third switch units, a plurality of position signal terminals, wherein the plurality of third switch units and the plurality of output terminals are arranged in a one-to-one correspondence, wherein each of the plurality of third switch units connects to one of the plurality of position signal terminals in a one-to-one correspondence, and wherein the plurality of third switch units is connected to a third power terminal; and wherein each of the plurality of third switch units responds to a signal of a corresponding one of the plurality of position signal terminals to connect the third power terminal to the corresponding one of the plurality of output terminals.

In some examples, the programmable storage array further comprises: a first switch unit connected to the first power terminal, a first control terminal, and a first node, wherein the first switch unit transmits a signal of the first power terminal to the first node in response to a signal of the first control terminal; wherein a first terminal of the first anti-fuse in each of the plurality of anti-fuse groups connects to the first node; and a second switch unit connected to the second power terminal, the first control terminal, and a second node, wherein the second switch unit transmits a signal of the second power terminal to the second node in response to the signal of the first control terminal; and wherein a first terminal of the second anti-fuse in each of the plurality of anti-fuse groups is connected to the second node.

In some examples, the programmable storage array further comprises: a plurality of D-type flip-flops, wherein the plurality of D-type flip-flops and the plurality of output terminals are arranged in a one-to-one correspondence, wherein a data input terminal of each of the plurality of D-type flip-flops is connected to a corresponding one of the plurality of output terminals, and a clock terminal of each of the plurality of D-type flip-flops is connected to a clock signal.

In some examples, the first switch unit comprises: a first transistor, a control terminal of the first transistor is connected to the first control terminal, the first terminal of the first transistor is connected to the first power terminal, and the second terminal the first transistor is connected to the first node.

In some examples, the second switch unit comprises: a second transistor, a control terminal of the second transistor is connected to the first control terminal, a first terminal of the second transistor is connected to the second power terminal, and the second terminal of the second transistor is connected to the second node.

In some examples, each of the plurality of third switch units comprises: a third transistor, a control terminal of the third transistor is connected to the corresponding position signal terminal, a first terminal of the third transistor is connected to the corresponding output terminal, and a second terminal of the third transistor is connected to the third power terminal.

In some examples, the third power terminal is a ground terminal.

According to another aspect of the present disclosure, a method for reacting and writing a programmable storage array is provided, the method comprises a reading phase and a writing phase:

wherein in the writing phase: in a first stage, inputting a first high-level signal to a first power terminal, inputting a low-level signal to a second power terminal and a third power terminal, and inputting an effective-level signal to a preset position signal terminal to turn on a third switch unit, to breakdown a corresponding first anti-fuse; in a second stage, inputting the first high-level signal to the second power terminal, inputting the low-level signal to the first power terminal and the third power terminal, and inputting the effective-level signal to the preset position signal terminal to turn on the third switch unit, to breakdown a corresponding second anti-fuse; and wherein in the reading phase: inputting a second high-level signal to the first power terminal, inputting a low-level signal to the second power terminal and the third power terminal, and inputting an invalid-level signal to a position signal terminal to turn off the third switch unit.

In some examples, each programmable storage cell in the programmable storage array comprises a D-type flip-flop, wherein the reading phase further comprises: inputting the effective-level signal to a clock terminal of the D-type flip-flop to write a first signal to a first output terminal of the D-type flip-flop, and write a second signal with an opposite logic level as the first signal to a second output terminal of the D-type flip-flop.

In some examples, the first high-level signal has a voltage of 6V, the second high-level signal has a voltage of 1V, and the low-level signal has a voltage of 0V.

It should be understood that the above general description and the following detailed description are only exemplary and explanatory, and cannot limit the present disclosure.

BRIEF DESCRIPTION OF THE DRAWINGS

The drawings herein are incorporated into the specification and constitute a part of the specification. They have shown embodiments consistent with the disclosure, and are used to explain the principle of the disclosure together with the specification. Obviously, the drawings in the following description are only some embodiments of the present disclosure. For those of ordinary skill in the art, other drawings can be obtained from these drawings without creative work.

DETAILED DESCRIPTION OF THE PREFERRED EMBODIMENTS

Implementations of the present disclosure are illustrated below through specific embodiments. Those skilled in the art can easily understand other advantages and efficacy of the present disclosure according to the content disclosed in this specification. The present disclosure can also be implemented or applied through other different specific implementations. Various modifications or variations can also be made on details in this specification based on different opinions and applications without departing from the spirit of the present disclosure.

It should be noted that, the figures provided in this embodiment merely illustrate the basic conception of the present disclosure schematically. Therefore, the figures only show components related to the present disclosure, and are not drawn according to the quantity, shapes and sizes of components during actual implementation. The pattern, quantity and ratio of components during actual implementation can be changed arbitrarily, and the component layout may also be more complex.

Exemplary embodiments will now be described more fully with reference to the accompanying drawings. However, the example embodiments can be implemented in various forms, and should not be construed as being limited to the examples set forth herein; on the contrary, the provision of these embodiments makes the present disclosure more comprehensive and complete, and fully conveys the concept of the exemplary embodiments to those skilled in the art. The same reference numerals in the figures represent the same or similar structures, and thus their detailed descriptions will be omitted.

Although relative terms such as "upper" and "lower" are used in this specification to describe the relative relationship between one component of an icon and another component, these terms are used in this specification only for convenience, for example, according to the drawings. The direction of the example described. It can be understood that if the device of the icon is turned over and turned upside down, the component described as "upper" will become the "lower" component. Other relative terms, such as "high", "low", "top", "bottom", "left" and "right" have similar meanings. When a structure is "on" another structure, it may mean that a certain structure is integrally formed on another structure, or that a certain structure is "directly" arranged on another structure, or that a certain structure is "indirectly" arranged on another structure through other structures.

The terms "a", "an" and "the" are used to indicate the existence of one or more elements/components/etc.; the terms "including" and "have" are used to indicate the open-ended meaning of including and refer to, in addition to the listed elements/composition divisions, etc., there may be other elements/composition divisions, etc.

Figure 1:
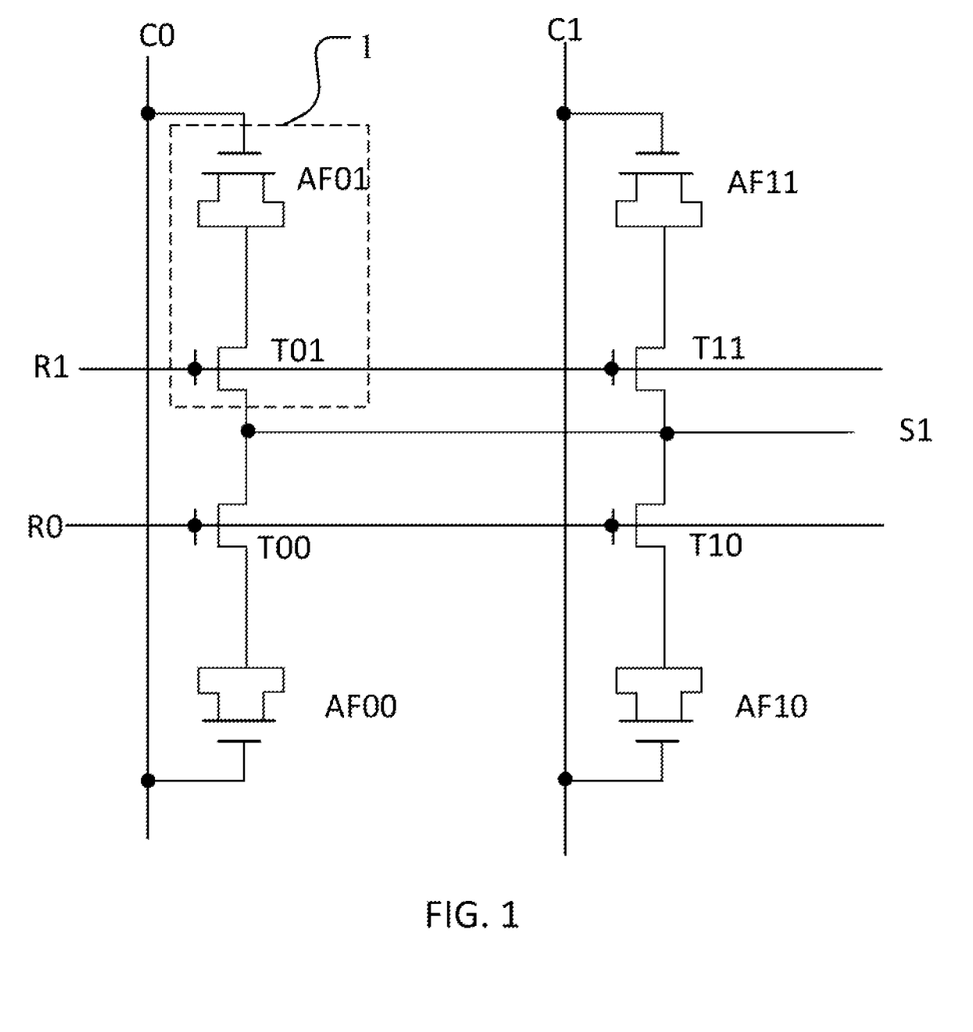
FIG. 1 is a schematic circuit structure diagram of a programmable storage array in the related art.

FIG. 1 is a schematic circuit structure diagram of a programmable storage array in the related art. The programmable storage array includes a plurality of programmable storage cells 1. FIG. 1 illustrates a 2×2 array as an example. The programmable memory unit 1 here includes an anti-fuse AF01 and a switching transistor T01. An anti-fuse is an electrical device that performs the opposite function to a fuse. An anti-fuse starts with a high resistance, and converts into a permanent electrically conductive path typically when the voltage across the anti-fuse exceeds a certain level. The first terminal of the anti-fuse AF01 is connected to the column control signal terminal C0, the second terminal of the anti-fuse AF01 is connected to the first terminal of the switching transistor T01, the second terminal of the switching transistor T01 is connected to the output terminal S1, and the control terminal of the switching transistor T01 is connected to the row control signal terminal R1. The output terminal S1 of the switching transistor T01 needs to be connected to an input terminal of a sensitivity amplifier.

However, on the one hand, in the related art, the programmable storage array has a complicated structure and a large area. On the other hand, in the related art, when the programmable storage array is applied to a dynamic random access memory, the signal of the column control signal terminal C0 is obtained through signal decoding on the bit line, and the signal of the row control signal terminal R1 is obtained through signal decoding on the word line. When the programmable storage array reads data, it is necessary to input valid electric level signals to the word line and the bit line, so that the signals of the column control signal terminal C0 and the row control signal terminal R1 are at the valid electric level. However, long word lines and bit lines generate large parasitic capacitance and parasitic resistance, resulting in a relatively slow data reading speed of the programmable storage array. On the other hand, the related art judges the logic state of the written data by comparing the voltages at the two input terminals of the sensitivity amplifier. However, the voltage difference between the two input terminals of the sensitivity amplifier SA when reading data is relatively small, so the programmable storage array is prone to misreading the data. Therefore, the stability of the programmable storage array is relatively poor.

Figure 2:
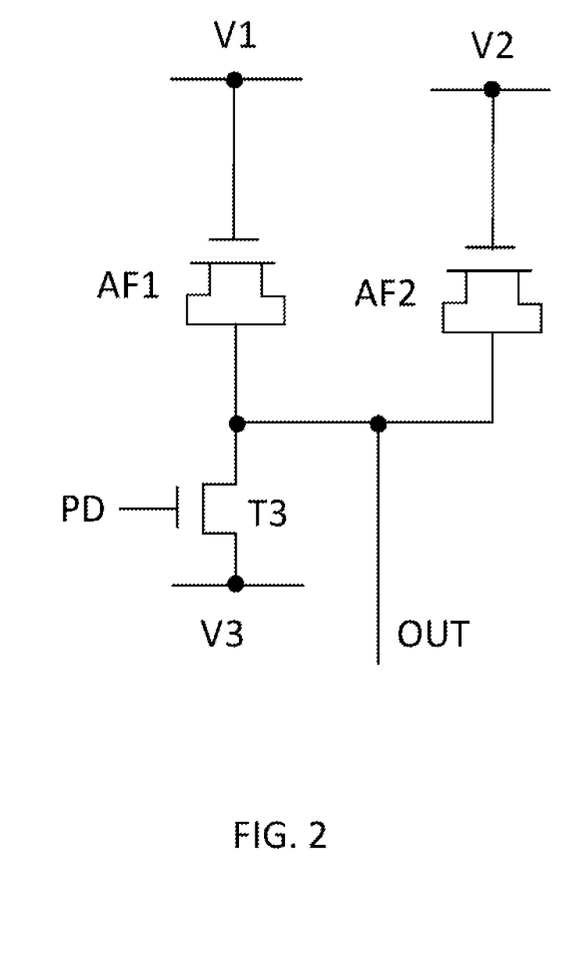
FIG. 2 is a schematic circuit structure diagram of a programmable storage cell according to an exemplary embodiment of the present disclosure.

Therefore, the exemplary embodiment first provides, as shown in FIG. 2, an exemplary programmable storage cell circuit diagram. The programmable storage cell includes: a first anti-fuse AF1, a second anti-fuse AF2, and a third switch unit T3. The first anti-fuse AF1 is connected between the first power terminal V1 and the output terminal OUT; the second anti-fuse AF2 is connected between the second power terminal V2 and the output terminal OUT; the third switch unit T3 is connected to the output terminal OUT, the third power terminal V3, and the position signal terminal PD, used to connect the third power terminal V3 and the output terminal OUT in response to a signal from the position signal terminal PD.

In this exemplary embodiment, when the programmable storage cell needs to write data "1", input a first high-level signal to the first power terminal V1, input a low-level signal to the second power terminal V2 and the third power terminal V3, and input an effective level signal to the position signal terminal PD to turn on the third switch unit T3, such that the first anti-fuse AF1 is broken down under the voltages between the first power terminal V1 and the third power terminal V3. When the programmable storage cell needs to read data "1", input a second high-level signal to the first power terminal V1, input a low-level signal to the second power terminal V2 and the third power terminal V3, and input an invalid level signal to the position signal terminal PD to turn off the third switch unit T3. At this time, since both ends of the first anti-fuse AF1 are connected, both ends of the second anti-fuse are disconnected, the output terminal OUT sends out a high-level signal "1". When the programmable storage cell needs to write data "0", input the first high-level signal to the second power terminal V2, input the low-level signal to the first power terminal V1 and the third power terminal V3, and input the effective level signal to the position signal terminal PD to turn on the third switch unit T3, so the second anti-fuse AF2 is broken down under the voltages between the second power terminal V2 and the third power terminal V3. When the programmable memory unit needs to read data "0", input the second high-level signal to the first power terminal V1, input a low-level signal to the second power terminal V2 and the third power terminal V3, and input the invalid level signal to the position signal terminal PD to turn off the third switch unit T3. At this time, since both ends of the second anti-fuse AF2 are connected, both ends of the first anti-fuse AF1 are disconnected, the output terminal OUT sends out a low-level voltage "0". Here, the first high-level signal is used to break down the anti-fuse element, therefore, the first high-level signal may be greater than the second high-level signal. For example, the first high-level signal voltage may be 6V, the second high-level signal voltage may be 1V, and the low-level voltage may be 0V.

In this exemplary embodiment, on the one hand, the programmable storage cell does not need to be provided with a sensitivity amplifier, thereby simplifying the structure of the programmable storage cell and reducing the occupied area of the programmable storage cell. On the other hand, in this example, the position signal terminal PD is provided with the decoded signals from the bit line and the word line. When the bit line and the word line are both at effective levels, the position signal terminal PD is at an effective signal level. This arrangement combines the two position signal terminals in the related technology into one position signal terminal through an "AND gate" in a decoder. At the same time, the arrangement has also reduced the number of switch units, thereby further simplified the programmable memory unit's structure. In addition, the position signal terminal PD outputs an invalid level signal during the data reading phase of the programmable storage cell, thereby avoiding the slow reading speed problem caused by the parasitic RC from the word lines and the bit lines. Further in addition, the resistances of the anti-fuse element in the breakdown state and the non-breakdown state differ at least by two orders of magnitude, so when reading data "1" and the data "0", the output terminal OUT has a large differential voltage. Therefor the programmable storage cell has a relatively higher stability.

Figure 3:
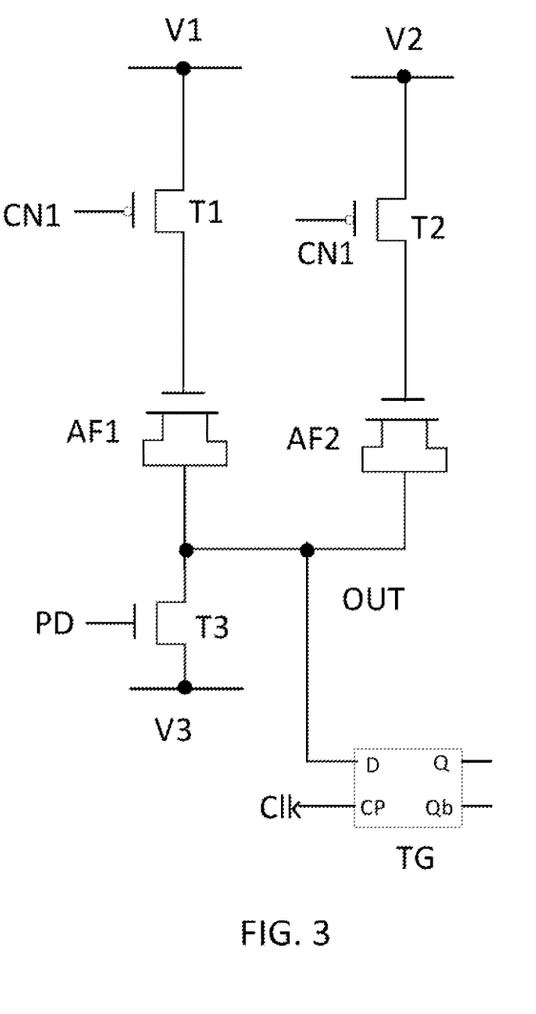
FIG. 3 is a schematic circuit structure diagram of a programmable storage cell according to another exemplary embodiment of the present disclosure.

FIG. 3 is a schematic circuit structure diagram of a programmable storage cell according to another exemplary embodiment of the present disclosure. The programmable storage cell also includes a first switch unit T1 and a second switch unit T2. The first switch unit T1 is connected to the first power terminal V1, the first terminal of the first anti-fuse AF1, and the first control terminal CN1, and is used to respond to a signal from the first control terminal CN1 in connection with the power terminal V1 and the first terminal of the first anti-fuse AF1. The second switch unit T2 is connected to the second power terminal V2, the first terminal of the second anti-fuse AF2, and the first control terminal CN1, and is used to respond to a signal from the first control terminal CN1 in connection with the power terminal V2 and the first terminal of the first anti-fuse AF2. When the programmable memory unit needs to read or write data, the first control terminal CN1 inputs an effective level signal to turn on the first switch unit T1 and the second switch unit T2. When writing data and reading data, the current flowing through the first anti-fuse AF1 and the second anti-fuse AF2 can be controlled by the voltage of the first control terminal CN1.

In the exemplary embodiment in FIG. 3, the programmable storage cell may further include a D-type flip-flop, with reference TG in the figure. Flip-flops and latches are commonly used as data storage elements. A flip-flop is a device which stores a single bit (binary digit) of data; one of its two states represents a "one" and the other represents a "zero", A D-type flip-flop is known as a "data" or "delay" flip-flop and often used as a dynamic storage cell. A D-type flip-flop typically connects to a clock signal Clk transitioning between low and high (0 to 1), an input data signal at terminal D, latched signal Q and reverse signal Qb, shown in FIG. 3. The D flip-flop captures the value of the D-input gat a definite portion of the clock cycle (such as the rising edge of the clock). That captured value becomes the Q output.

Referring to FIG. 3, the data input terminal D of the D-type flip-flop TG is connected to the output terminal OUT of the autifuses, and the CP terminal is connected to a clock signal terminal Clk. When the clock signal terminal Clk is at an effective level, the D-type flip-flop latches the signal of the output terminal OUT at the Q terminal of the D-type flip-flop and latches the reverse logic signal of the output terminal at the Qb terminal of the D-type flip-flop.

In the exemplary embodiment of FIGS. 2 and 3, the third switch unit T3 may include a third transistor, the control terminal of the third transistor is connected to the position signal terminal PD, and the first terminal of the third transistor is connected to the output terminal OUT, the second terminal of the third transistor is connected to the third power terminal V3.

In the example of FIG. 3, the first switch unit T1 may include a first transistor, the control terminal of the first transistor is connected to the first control terminal CN1 and the first terminal is connected to the first power terminal V1, the second terminal is connected to the first terminal of the first anti-fuse AF1; the second switch unit T2 may include a second transistor, the control terminal of the second transistor is connected to the first control terminal CN1, the first terminal is connected to the second power V2, and the second terminal is connected to the first terminal of the second anti-fuse AF2.

Among them, the first transistor, the second transistor, and the third transistor may be either N-type transistors or P-type transistors. In this specific example, the first transistor and the second transistor are P-type transistors, and the third transistor is an N-type transistor.

Figure 4:
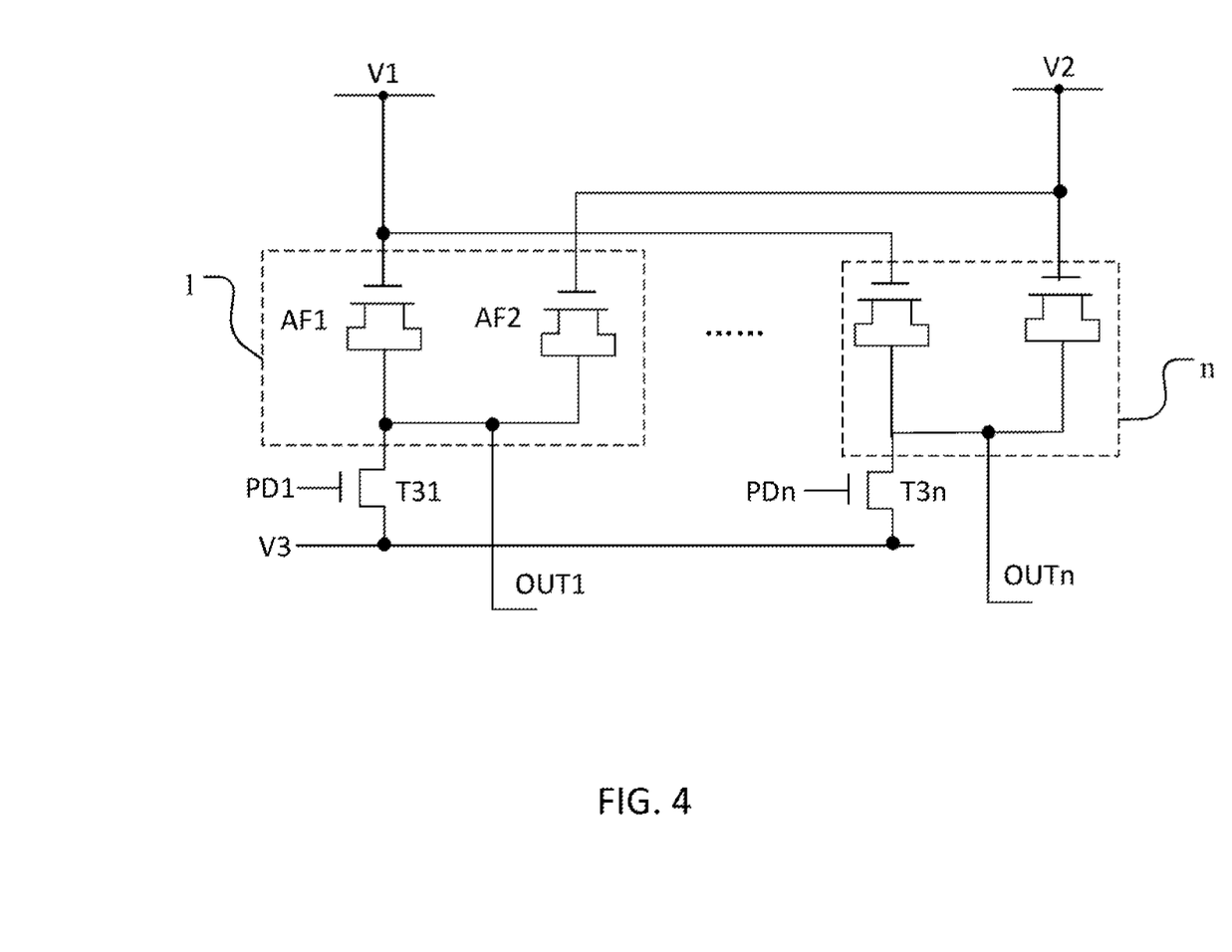
FIG. 4 is a schematic circuit structure diagram of a programmable storage array according to an exemplary embodiment of the present disclosure.

FIG. 4 is a schematic circuit structure diagram of a programmable storage array according to an exemplary embodiment of the present disclosure. The programmable storage array includes: a plurality of anti-fuse groups 1, . . . n, a plurality of third switch units T31 . . . T3n, each of the anti-fuse groups 1 . . . n is connected to different output terminals OUT1 . . . OUTn respectively, each anti-fuse group includes a first anti-fuse AF1 and a second anti-fuse AF2, wherein the first anti-fuse AF1 is connected between the corresponding output terminal and the first power terminal V1. The second anti-fuse AF2 is connected between the corresponding output terminal and the second power terminal V2; the third switch units T31 . . . T3n and the output terminals OUT1 . . . OUTn have one-to-one correspondence, and each of the third switch units is respectively connected to a different output terminal and a different position signal terminal of the PD1 . . . PDn, wherein the third switch units are also connected to the third power terminal V3, in response to the signal from the corresponding position signal terminal to connect the third power terminal V3 with the corresponding output terminal. In essence, the programmable storage array includes a number of the above-mentioned programmable storage cells.

The anti-fuse group 1 is described as an example for the embodiment. When the programmable storage array needs to write data "1" to the anti-fuse group 1, a first high-level signal is input to the first power terminal V1, a low-level signal is input to the second power terminal V2 and the third power terminal V3, and an effective level signal is input to the position signal terminal PD1 to turn on the third switch unit T31, then the first anti-fuse AF1 has breakdown between the first power terminal V1 and the third power terminal. The voltage between the power supply terminals V3 is broken down. When the programmable storage array needs to read data "1" from the anti-fuse group, a second high-level signal is input to the first power terminal V1, a low-level signal is input to the second power terminal V2 and the third power terminal V3, and an invalid-level signal is input to the position signal terminal PD1 to turn off the third switch unit T31. At this time, both ends of the first anti-fuse AF1 are connected and both ends of the second anti-fuse are disconnected, so that the output terminal OUT1 outputs a high-level signal "1". When the programmable storage array needs to write data "0" to the anti-fuse group 1, the first high-level signal is input to the second power terminal V2, and the low-level signal is input to the first power terminal V1 and the third power terminal V3, an effective level signal is input to the position signal terminal PD1 to turn on the third switch unit T31, then the second anti-fuse AF2 has a breakdown under the voltages between the second power terminal V2 and the third power terminal V3. When the programmable storage array needs to read data "0" from the anti-fuse group 1, a second high-level signal is input to the first power terminal V1, and a low-level signal is input to the second power terminal V2 and the third power terminal V3, and an invalid level signal is input to the position signal terminal PD1 to turn off the third switch unit T31. At this time, since both ends of the second anti-fuse AF2 are connected, both ends of the first anti-fuse AF1 are disconnected, so that the output terminal OUT1 sends out a high-level signal "0". Here, the first high-level signal is used to breakdown the anti-fuse. Therefore, the first high-level signal is greater than the second high-level signal. For example, the first high-level signal voltage may be 6V, the second high-level signal voltage may be 1V, and the low-level voltage may be 0V.

In this example, it is not necessary to provide a sensitivity amplifier in the programmable storage array, thereby simplifies the programmable storage array structure and reduces the area occupied by the programmable storage array. In addition, according to the embodiment, signals on the position signal terminals PD1 . . . PDn are obtained by decoding signals on the bit lines and word lines. When signals on the bit lines and the word lines are both effective-level signals, signals on the position signal terminals PD1 . . . PDn are also at effective levels. This arrangement combines two position signal terminals in the related technology into one position signal terminal through an "AND gate" in the decoder. Thus, the number of switch units is reduced, further simplifying the structure of the programmable storage array. Furthermore, when the programmable storage array is in data reading phase, output signals at the position signal terminals PD1 . . . PDn are at invalid-level, the slow reading speed caused by the internal RC voltage drops in the word lines and the bit lines are avoided. Even more, the anti-fuse's resistances in the breakdown state and the non-breakdown state differ by two orders of magnitude, so when reading data "1" and data "0", the voltage difference at the output terminal OUT1 is relatively large, thereby the programming storage array has a high stability. Furthermore, there is no need for providing sensitivity amplifiers and no need for word lines and bit lines to position during reading, the stored information in the programmable storage array can be read out in parallel, significantly improving the reading speed of the programmable storage array.

Figure 5:
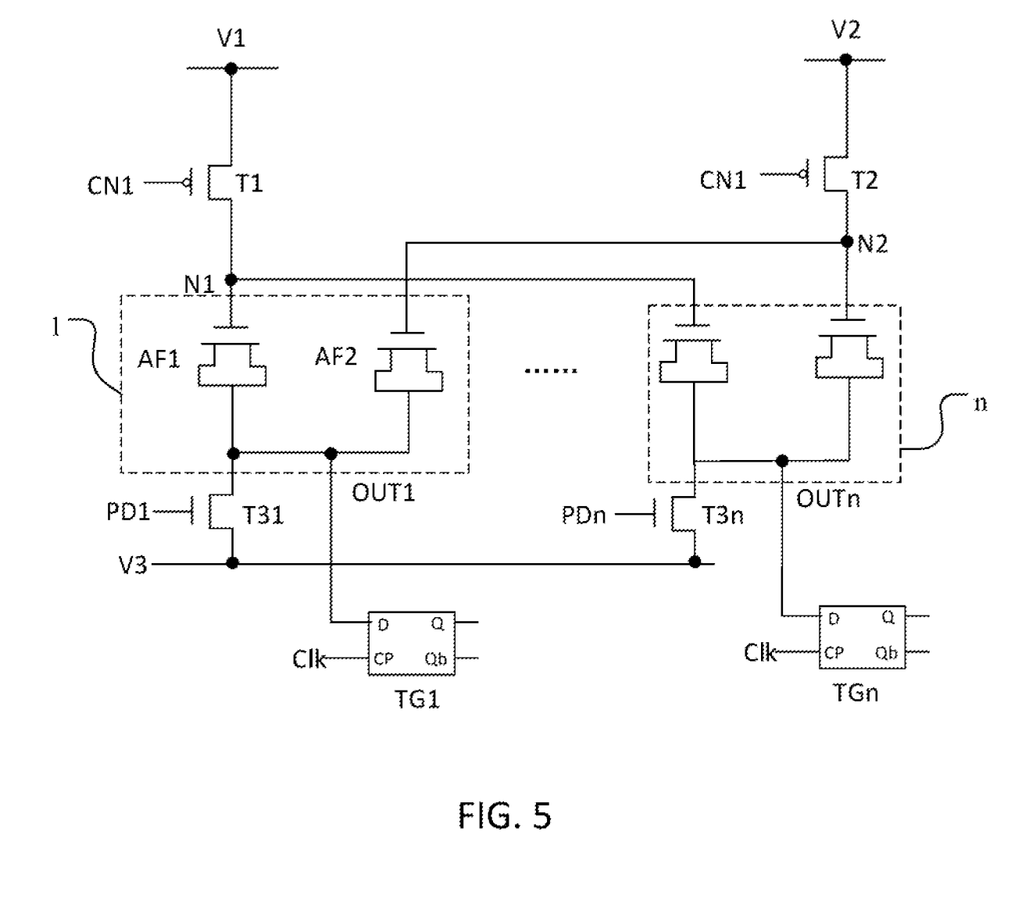
FIG. 5 is a schematic circuit structure diagram of a programmable storage array according to another exemplary embodiment of the present disclosure.

FIG. 5 is a schematic circuit structure diagram of a programmable storage array according to another exemplary embodiment of the present disclosure. The programmable storage array may further include: a first switch unit T1 and a second switch unit T2. The first switch unit T1 is connected to the first power terminal V1, the first control terminal CN1, and the first node N1. The first switch unit T1 is used to respond to the signal of the first control terminal CN1 in order to transmit the signal of the first power terminal V1 to the node N1, where the first node N1 is connected to the first terminals of multiple first anti-fuses AF1; the second switch unit T2 is connected to the second power terminal V2, the first control terminal CN1, and the second node N2. The second switch unit T2 is used to respond to the signal of the first control terminal CN1 to transmit the signal of the second power supply terminal V2 to the second node N2, wherein the second node N2 is connected to the first terminals of multiple second anti-fuses AF2. When the programmable storage array needs to read or write data, the first control terminal CN1 inputs an effective-level signal to turn on the first switch unit T1 and the second switch unit T2.

In this exemplary embodiment, as shown in FIG. 5, the programmable storage array may further include a plurality of D-type flip-flops TG1 . . . TGn, the D-type flip-flops TG1 . . . TGn and the output terminal OUT1 . . . OUTn are arranged to be in one-to-one correspondence. The data input terminal of each D-type flip-flop is connected to a different output terminal. The CP terminal is connected to the clock signal terminal Clk. When the clock signal terminal Clk is at an effective level, the D-type flip-flop latches the signal at the output of the Q terminal of the D-type flip-flop and latches the reverse logic signal at the output Qb terminal of the D-type flip-flop.

In this exemplary embodiment, as shown in FIG. 5, the first switch unit may include a first transistor, the control terminal of the first transistor is connected to the first control terminal, and the first terminal of the first transistor is connected to the first power terminal, and the second terminal of the first transistor is connected to the first node.

In this exemplary embodiment, as shown in FIG. 5, the second switch unit may include a second transistor, the control terminal of the second transistor is connected to the first control terminal, and the first terminal of the second transistor is connected to the second power terminal, and the second terminal of the second transistor is connected to the second node.

In some embodiments, as shown in FIGS. 4 and 5, the third switch unit may include a third transistor, the control terminal of the third transistor is connected to its corresponding position signal terminal, and the first terminal of the third transistor is connected to its corresponding output terminal, and the second terminal of the third transistor is connected to the third power terminal.

Among them, the first transistor, the second transistor, and the third transistor may be either N-type transistors or P-type transistors. In this specific example, the first transistor and the second transistor are P-type transistors, and the third transistor is an N-type transistor.

In this specific example, the third power terminal V3 may be a ground terminal.

This exemplary embodiment also provides a method for reading and writing a programmable storage array. The method includes the following.

In the writing phase:

In the first stage, input a first high-level signal to the first power terminal, input a low-level signal to the second power terminal and the third power terminal, and input a preset effective-level signal to the position signal terminal to turn on the third switch unit, thereby breaking down the corresponding first anti-fuse;

In the second stage, input the first high-level signal to the second power terminal, input the low-level signal to the first power terminal and the third power terminal, and input a preset effective-level signal to the position signal terminal to turn on the third switch unit, thereby breaking down the corresponding second anti-fuse;

In the reading phase:

Input a second high-level signal to the first power terminal, input a low-level signal to the second power terminal and the third power terminal, and input an invalid-level signal to the position signal terminal to turn off the third switch unit.

This specific example describes a programmable storage array which includes four anti-fuse groups 1, 2, 3, and 4. When writing data 0000 to the programmable storage array, the second anti-fuses in the anti-fuse groups 1, 2, 3, and 4 should have the breakdowns. When writing data 0001 to the programmable storage array, the second anti-fuses in the anti-fuse groups 1, 2, and 3 and the first anti-fuse in the anti-fuse groups 4 should have the breakdowns. When writing data 0010 to the programmable storage array, the second anti-fuses in the anti-fuse groups 1, 2, 4 and the first anti-fuse in the anti-fuse group 3 should have breakdowns. When writing data 1111 to the programmable storage array, the first anti-fuses in the anti-fuse groups 1, 2, 3, and 4 should have breakdowns.

In this exemplary embodiment, the reading phase may further include:

Input an effective-level signal to the CP terminal of each D-type flip-flop to write the signal at the output terminal to the first output terminal of the D-type flip-flop, and write to the second output terminal of the D-type flip-flop a signal with the opposite logic level of the first output terminal.

In the specific example, the first high-level signal voltage may be 6V, the second high-level signal voltage may be 1V, and the low-level voltage may be 0V.

Those skilled in the art will easily think of other embodiments of the present disclosure after considering the specification and practicing the disclosure disclosed herein. This application is intended to cover any variations, uses, or adaptive changes of the present disclosure. These variations, uses, or adaptive changes follow the generality of the present disclosure and include common knowledge or conventional technical means in the technical field not disclosed in the present disclosure. The description and the embodiments are only regarded as exemplary, and the true scope and spirit of the present disclosure are pointed out by the claims.

It should be understood that the present disclosure is not limited to the precise structure that has been described above and shown in the drawings, and various modifications and changes can be made without departing from its scope. The scope of the present disclosure is limited only by the appended claims.

What is claimed is:

1. A programmable storage cell, comprising:
   a first anti-fuse connected between a first power terminal and an output terminal;
   a second anti-fuse connected between a second power terminal and the output terminal; and
   a third switch unit connected to the output terminal, a third power terminal, and a position signal terminal, wherein the third switch unit connects the third power terminal and the output terminal in response to a signal from the position signal terminal.

2. The programmable storage cell according to claim 1, further comprising:
   a first switch unit connected to the first power terminal, a first terminal of the first anti-fuse, and a first control terminal, wherein the first switch unit connects the first power terminal and the first terminal of the first anti-fuse in response to a signal from the first control terminal; and
   a second switch unit connected to the second power terminal, a first terminal of the second anti-fuse, and the first control terminal, wherein the second switch unit connects the second power terminal and the first terminal of the second anti-fuse in response to the signal from the first control terminal.

3. The programmable storage cell according to claim 1, further comprising:
   a D-type flip-flop, wherein a data input terminal of the D-type flip-flop is connected to the output terminal, and wherein a clock terminal of the D-type flip-flop is connected to a clock signal.

4. The programmable storage cell according to claim 1, wherein the third switch unit comprises:
   a third transistor, wherein a control terminal of the third transistor is connected to the position signal terminal, a first terminal of the third transistor is connected to the output terminal, and a second terminal of the third transistor is connected to the third power terminal.

5. The programmable storage cell of claim 2, wherein the first switch unit comprises:
   a first transistor, wherein a control terminal of the first transistor is connected to the first control terminal, a first terminal of the first transistor is connected to the first power terminal, and the second terminal of the first transistor is connected to the first terminal of the first anti-fuse; and
   wherein the second switch unit comprises:
      a second transistor, wherein a control terminal of the second transistor is connected to the first control terminal, a first terminal of the second transistor is connected to the second power terminal, and the second terminal of the second transistor is connected to the first terminal of the second anti-fuse.

6. A programmable storage array, comprising:
   a plurality of anti-fuse groups;
   a plurality of output terminals, wherein each of the plurality of anti-fuse groups connects to one of the plurality of output terminals in a one-to-one correspondence, wherein each of the plurality of anti-fuse groups comprises a first anti-fuse and a second anti-fuse, wherein the first anti-fuse is connected between a first power terminal and a corresponding one of the plurality of output terminals, and the second anti-fuse is connected between a second power terminal and a corresponding one of the plurality of output terminals;
   a plurality of third switch units; and
   a plurality of position signal terminals, wherein the plurality of third switch units and the plurality of output terminals are arranged in a one-to-one correspondence, wherein each of the plurality of third switch units connects to one of the plurality of position signal terminals in a one-to-one correspondence, wherein the plurality of third switch units is connected to a third power terminal; and
   wherein each of the plurality of third switch units responds to a signal of a corresponding one of the plurality of position signal terminals to connect the third power terminal and the corresponding one of the plurality of output terminals.

7. The programmable storage array according to claim 6, further comprising:
   a first switch unit connected to the first power terminal, a first control terminal, and a first node, wherein the first switch unit transmits a signal of the first power terminal to the first node in response to a signal of the first control terminal; wherein a first terminal of the first anti-fuse in each of the plurality of anti-fuse groups connects to the first node; and
   a second switch unit connected to the second power terminal, the first control terminal, and a second node, wherein the second switch unit transmits a signal of the second power terminal to the second node in response to the signal of the first control terminal; and wherein a first terminal of the second anti-fuse in each of the plurality of anti-fuse groups is connected to the second node.

8. The programmable storage array according to claim 6, further comprising:
   a plurality of D-type flip-flops, wherein the plurality of D-type flip-flops and the plurality of output terminals are arranged in a one-to-one correspondence, wherein a data input terminal of each of the plurality of D-type flip-flops is connected to a corresponding one of the plurality of output terminals, and a clock terminal of each of the plurality of D-type flip-flops is connected to a clock signal.

9. The programmable storage array according to claim 7, wherein the first switch unit comprises:
   a first transistor, a control terminal of the first transistor is connected to the first control terminal, a first terminal of the first transistor is connected to the first power terminal, and a second terminal of the first transistor is connected to the first node.

10. The programmable storage array according to claim 7, wherein the second switch unit comprises:
    a second transistor, a control terminal of the second transistor is connected to the first control terminal, a first terminal of the second transistor is connected to the second power terminal, and a second terminal of the second transistor is connected to the second node.

11. The programmable storage array according to claim 6, wherein each of the plurality of third switch units comprises:
  a third transistor, a control terminal of the third transistor is connected to the corresponding position signal terminal, a first terminal of the third transistor is connected to the corresponding output terminal, and a second terminal of the third transistor is connected to the third power terminal.

12. The programmable storage array according to claim 6, wherein the third power terminal is grounded.

13. A method for reading and writing a programmable storage array, comprising a reading phase and a writing phase:
  wherein in the writing phase:
    in a first stage, inputting a first high-voltage level signal to a first power terminal, inputting a low-voltage level signal to a second power terminal and a third power terminal, and inputting an effective-voltage level signal to a preset position signal terminal to turn on a third switch unit, in order to breakdown a corresponding first anti-fuse;
    in a second stage, inputting the first high-voltage level signal to the second power terminal, inputting the low-voltage level signal to the first power terminal and the third power terminal, and inputting the effective-voltage level signal to the preset position signal terminal to turn on the third switch unit, in order to breakdown a corresponding second anti-fuse; and
  wherein in the reading phase:
    inputting a second high-voltage level signal to the first power terminal, inputting a low-voltage level signal to the second power terminal and the third power terminal, and inputting an invalid-voltage level signal to the position signal terminal to turn off the third switch unit.

14. The method for reading and writing the programmable storage array according to claim 13, wherein each programmable storage cell in the programmable storage array comprises a D-type flip-flop, wherein the reading phase further comprises:
  inputting the effective-voltage level signal to a clock terminal of the D-type flip-flop to write a first signal to a first output terminal of the D-type flip-flop, and write a second signal with an opposite logic level as the first signal to a second output terminal of the D-type flip-flop.

15. The method for reading and writing the programmable storage array according to claim 13, wherein: the first high-voltage level signal has a voltage of 6V, the second high-voltage level signal has a voltage of 1V, and the low-voltage level signal has a voltage of 0V.

* * * * *